United States Patent
Bartlau et al.

(10) Patent No.: US 6,541,351 B1
(45) Date of Patent: Apr. 1, 2003

(54) METHOD FOR LIMITING DIVOT FORMATION IN POST SHALLOW TRENCH ISOLATION PROCESSES

(75) Inventors: Peter H. Bartlau, Westford, VT (US); Marc W. Cantell, Sheldon, VT (US); Jerome B. Lasky, Essex Junction, VT (US); James D. Weil, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/989,585

(22) Filed: Nov. 20, 2001

(51) Int. Cl.[7] ................................................. H01L 21/76
(52) U.S. Cl. ...................... 438/426; 438/424; 438/705
(58) Field of Search ...................... 438/296, 424, 438/426, 440, 705, 775

(56) References Cited

U.S. PATENT DOCUMENTS

| | | | |
|---|---|---|---|
| 5,923,991 A | * | 7/1999 | Bronner et al. ............. 438/424 |
| 5,960,297 A | | 9/1999 | Saki |
| 5,998,278 A | | 12/1999 | Yu |
| 6,027,982 A | | 2/2000 | Peidous et al. |
| 6,093,619 A | | 7/2000 | Huang et al. |
| 6,121,110 A | | 9/2000 | Hong et al. |
| 6,165,871 A | | 12/2000 | Lim et al. |
| 6,180,493 B1 | | 1/2001 | Chu |
| 6,187,651 B1 | | 2/2001 | Oh |
| 6,197,659 B1 | * | 3/2001 | Liu ............................ 438/424 |
| 6,245,619 B1 | * | 6/2001 | Boyd et al. ................. 438/289 |
| 6,248,641 B1 | | 6/2001 | Liu et al. |
| 6,251,746 B1 | | 6/2001 | Hong et al. |
| 6,261,921 B1 | * | 7/2001 | Yen et al. ................... 438/424 |
| 6,271,094 B1 | * | 8/2001 | Boyd et al. ................. 438/287 |
| 6,335,261 B1 | * | 1/2002 | Natzle et al. ............... 438/435 |
| 2002/0028555 A1 | * | 3/2002 | Boyd et al. ................. 438/299 |

* cited by examiner

*Primary Examiner*—Carl Whitehead, Jr.
*Assistant Examiner*—David S Blum
(74) *Attorney, Agent, or Firm*—Schmeiser, Olsen & Watts; William D. Sabo

(57) ABSTRACT

A method for limiting divot formation in shallow trench isolation structures. The method includes: providing a trench formed in a silicon region with a deposited oxide; oxidizing a top layer of the silicon region to form a layer of thermal oxide on top of the silicon region; and selectively etching the thermal oxide with respect to the deposited oxide.

23 Claims, 9 Drawing Sheets

METHOD FOR LIMITING DIVOT FORMATION IN POST SHALLOW TRENCH ISOLATION PROCESSES

FIELD OF THE INVENTION

The present invention relates to the fabrication of semiconductor devices; more specifically, it relates to method for limiting divot formation in a shallow trench isolation (STI) structures used in semiconductor devices.

BACKGROUND OF THE INVENTION

The trend in semiconductor device fabrication towards smaller, faster and more densely packed devices has led to the development of STI and as gate dielectrics have trended thinner, nitrogen implanted gate dielectrics. In the STI technique, a trench surrounding a semiconductor device such as a transistor is etched into a semiconductor substrate and then filled with a dielectric material. In the nitrogen implanted gate dielectric technique, nitrogen atoms are introduced into gate oxide in order to increase the dielectric constant of the gate. A side effect of this implant has been to increase the etch rate of the STI dielectric. Increasing the etch rate of the STI dielectric has lead to an increase in the propensity for and size of STI divots.

FIG. 1 is a top view of a semiconductor transistor illustrating an STI divot. In FIG. 1, semiconductor device 100 (in the present example a complementary metal oxide silicon (CMOS) transistor, is surrounded by an STI dielectric 105. Semiconductor device 100 includes source/drain regions 110 formed in silicon and separated by a channel region 115. A gate 120 (generally polysilicon over a gate dielectric) is formed over channel region 115 and overlaps source/drain regions 110. A divot 125 has been formed in STI 105 adjacent to semiconductor device 100.

FIG. 2 is a side view through 2—2 of FIG. 1. FIG. 5 illustrates the device of FIG. 1 fabricated in silicon-on-insulator (SOI) technology. In SOI technology, a layer of oxide is formed on a silicon substrate and a silicon layer formed on the oxide layer. In FIG. 2, channel region 115 and STI 105 are formed on top of a buried oxide (BOX) layer 135. Gate dielectric 130 and gate 120 are formed over STI 105 and channel region 115. Divot 125 clearly illustrated in STI 105 where the STI and channel region 115 meet. The thickness of channel region 115 is "D1" under gate 120, but decreases to thickness "D2" at the STI 105/channel region 115 interface due to the presence of divot 125 in the STI. Gate dielectric 130 and gate 120 fill in divot 125 forming a "corner device." A corner device causes leakage because a conductive inversion layer will form in channel region 115 near divot 125 at a lower voltage than the normal turn-on voltage of the central portions of the device because "D2" is less than "D1."

Referring again to FIG. 1, divot 125 extends along the entire periphery of semiconductor device 100. In addition to the "corner" device described above, divot 125 may result in the need to over-etch gate polysilicon during definition of gate 120 in order to remove polysilicon from the divot. If polysilicon is not removed from divot 125, gate to source/drain shorts may result. If the over etch is too much, then punch through of gate oxide 130 (see FIG. 2) may occur during the definition of gate 120 resulting in unwanted etching of the underlying silicon. A method that eliminates or reduces STI divot formation would eliminate or reduce both the leakage problem and polysilicon etch related problems. However, to be economically viable, such a method must add as little change to the current fabrication processes as possible.

SUMMARY OF THE INVENTION

A first aspect of the present invention is a method for limiting divot formation in shallow trench isolation structures comprising: providing a trench formed in a silicon region with a deposited oxide within the trench; oxidizing a top layer of the silicon region to form a layer of thermal oxide on top of the silicon region; and selectively etching the thermal oxide with respect to the deposited oxide.

A second aspect of the present invention is a method for forming shallow trench isolation structures comprising: forming a layer of thermal oxide on a silicon region; forming a trench through the layer of thermal oxide into the silicon region; filling the trench with a deposited oxide; and selectively etching the thermal oxide with respect to the deposited oxide.

A third aspect of the present invention is a method for forming shallow trench isolation structures comprising: forming a first layer of thermal oxide on a silicon region; forming a trench through the first layer of thermal oxide into the silicon region; filling the trench with a deposited oxide; removing the first layer of thermal oxide and a top surface portion of the deposited oxide; forming a second layer of thermal oxide on the silicon region; and selectively etching predefined areas of the second layer of thermal oxide with respect to the deposited oxide.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1:
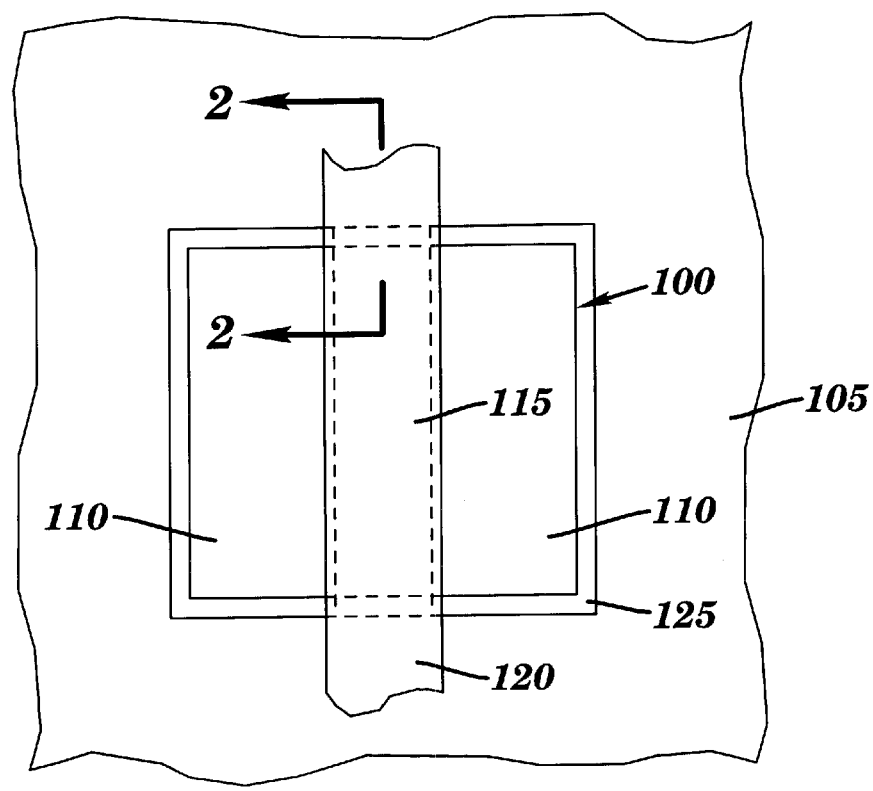
FIG. 1 is a top view of a semiconductor transistor illustrating an STI divot.
Figure 2:
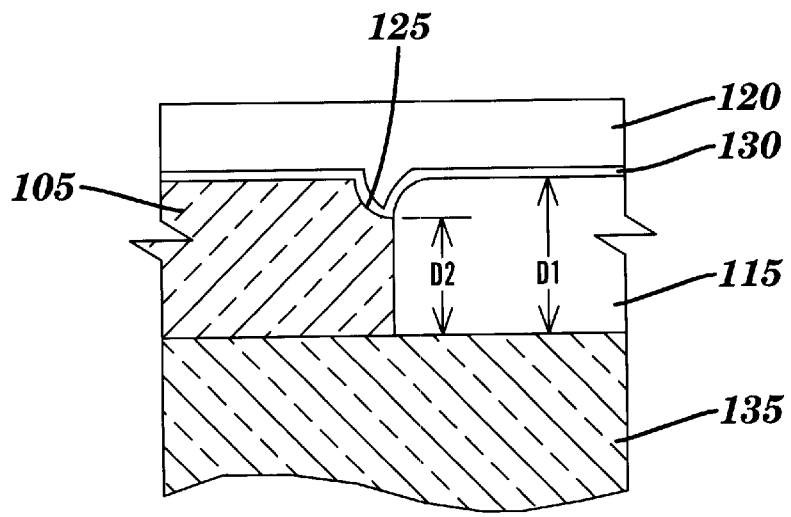
FIG. 2 is a side view through 2—2 of FIG. 1.
Figure 3A:
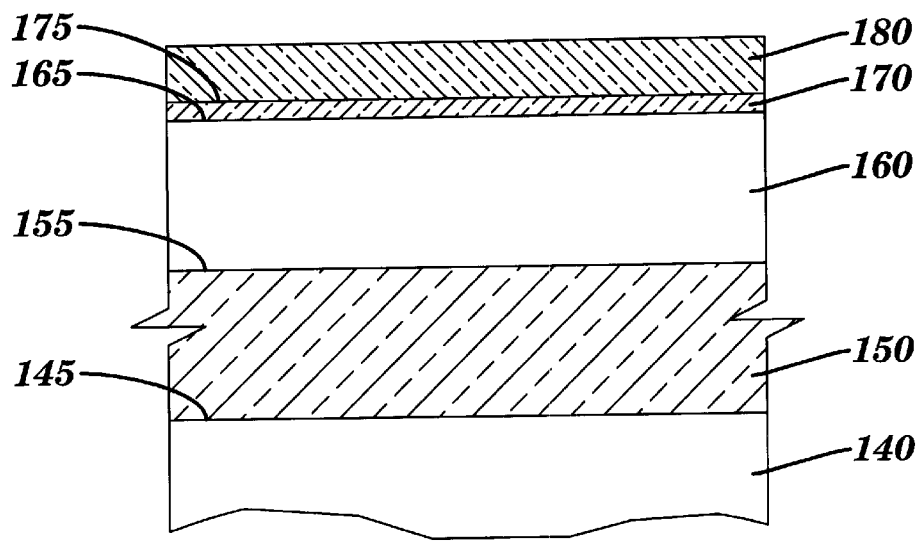
FIGS. 3A through 3G are partial cross-sectional views illustrating STI divot formation.

FIGS. 3A through 3G are partial cross-sectional views illustrating STI divot formation. In FIG. 3A, a silicon substrate 140 has a top surface 145. Formed on top surface 145 of silicon substrate 140 is a BOX layer 150 having a top surface 155. Formed on top surface 155 of BOX layer 150 is a silicon layer 160 having a top surface 165. In one example, silicon layer 160 is about 300 to 2000 Å thick. Formed on top surface 165 of silicon layer 160 is a pad oxide layer 170 having a top surface 175. Formed on top surface 175 of pad oxide layer 170 is a pad nitride layer 180. In one example, pad oxide layer 170 is a thermal oxide formed by oxidation of upper portions of silicon layer 160 and is about 60 to 250 Å thick and pad nitride layer 180 is formed by a chemical vapor deposition (CVD) process and is about 500 to 1500 Å thick.

Figure 3B:
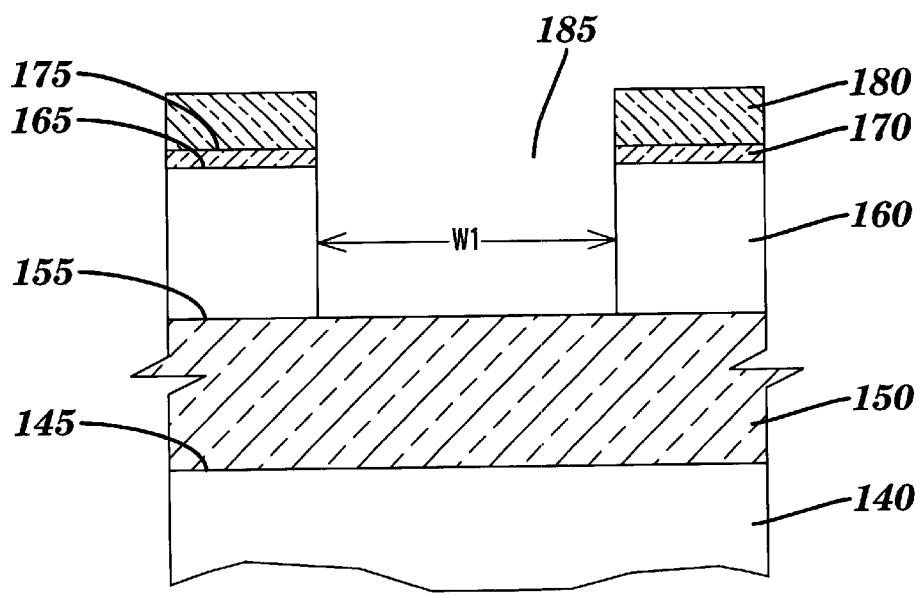

In FIG. 3B, a trench 185 is formed through pad nitride layer 180, pad oxide layer 170 and silicon layer 160 to expose top surface 155 of BOX layer 150. Trench 185 is formed by forming and patterning a photoresist layer on pad nitride layer 180, plasma etching the pad nitride layer, stripping the photoresist layer, wet etching the pad oxide layer, and plasma etching the silicon layer. Trench 185 is "W1" wide. In one example, "W1" is 500 Å or greater.

Figure 3C:
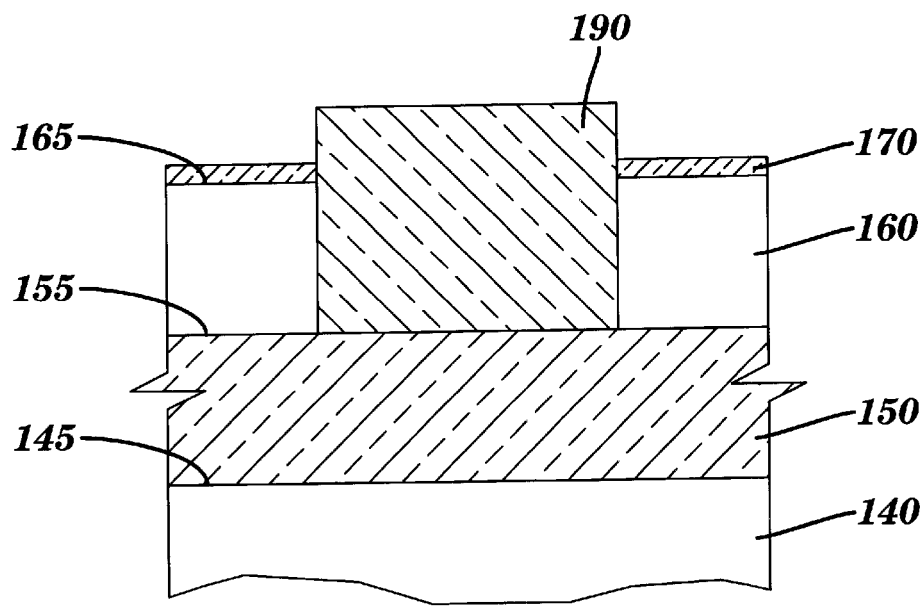

In FIG. 3C, trench 185 (see FIG. 3B) is filled with dielectric, in the present example, a high-density plasma (HDP) oxide; the oxide is chemically-mechanically-polished (CMP) to form STI 190 and pad nitride layer 180 (see FIG. 3B) removed. The removal of pad nitride layer 180 reduces the thickness of pad oxide layer 170 from about 60 to 250 Å to about 45 to 250 Å.

Figure 3D:
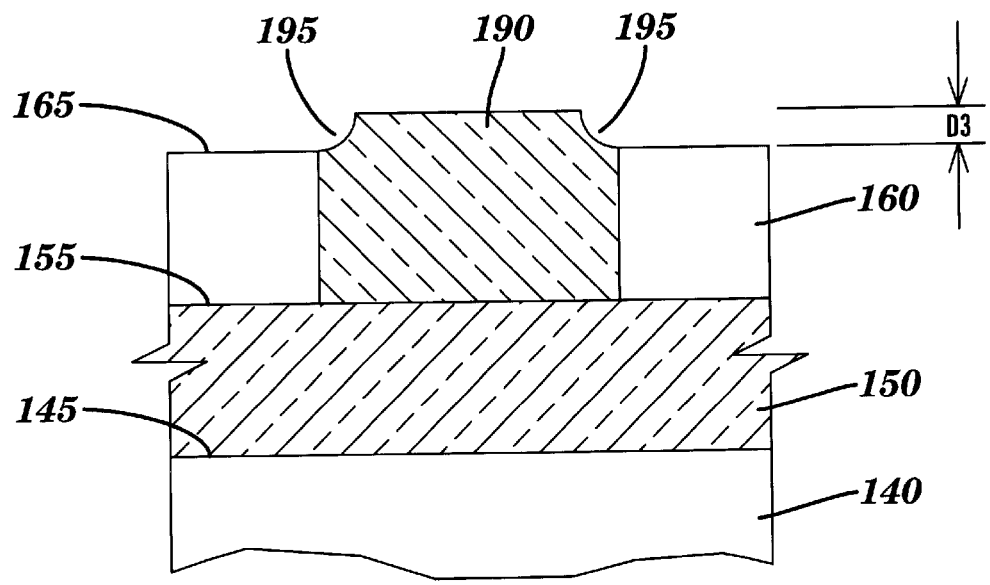

In FIG. 3D, pad oxide layer 170 (see FIG. 3C) is removed using a dilute hydrofluoric acid etchant (DHF) to expose top surface 165 of silicon layer 160. DHF comprises an aqueous solution of 1 part 49% HF by weight to 8 parts of water by weight. The etch rate of the HDP oxide of STI 190 in DHF is about one to three times the etch rate of the thermal oxide of pad oxide layer 170 in DHF. In order to ensure that all of pad oxide layer 170 is removed an over etch is performed. The etch time of the pad oxide layer removal process in DHF is selected to remove about 70 to 400 Å of pad oxide, though only about 45 to 250 Å are present. Some of STI 190 is also removed. After removal of pad oxide layer 170, STI 190 extends a distance "D3" above top surface 165 of silicon layer 160. In one example, "D3" is about 700 to 1300 Å. Since DHF is an isotropic etchant for oxides, that is, DHF etches in all directions equally; concavities 195 are formed along the exposed periphery of STI 190.

Figure 3E:
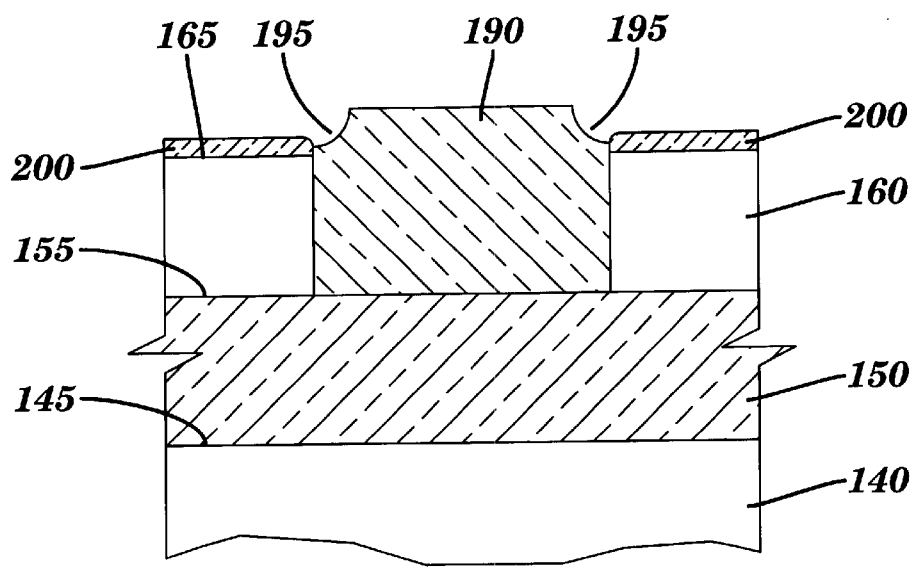

In FIG. 3E, a sacrificial oxide layer 200 is thermally grown on top surface 165 of silicon layer 160. By the nature of thermal oxidation processes, an upper portion of silicon layer 160 is converted to silicon oxide. In one example, sacrificial oxide layer 200 is 40 to 250 Å thick. At this point, various fabrication processes may be performed. For example, in the case of complementary-metal-oxide-silicon (CMOS) device fabrication Nwell and Pwell ion implants are performed. The purpose of sacrificial oxide layer 200 is to protect top surface 165 of silicon layer 160.

Figure 3F:
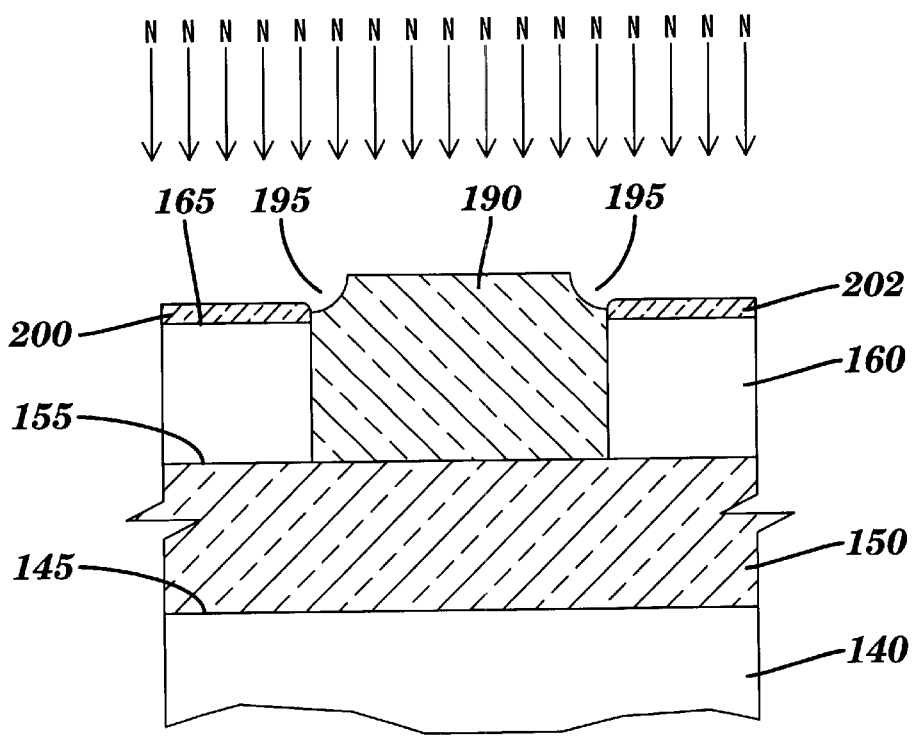

In FIG. 3F, sacrificial oxide layer 200 (see FIG. 3E) is removed using DHF. In order to ensure that all of sacrificial oxide layer 200 is removed an over etch is performed. The etch time of the sacrificial oxide layer removal process in DHF is selected to remove about 70 to 400 Å of sacrificial oxide, though only about 40 to 250 Å are present. Continuing the example of a CMOS device, about a 20 to 70 Å thick thermal gate oxide layer 202 is grown on top surface 165 of silicon layer 160. A nitrogen ion implantation is then performed.

Figure 3G:
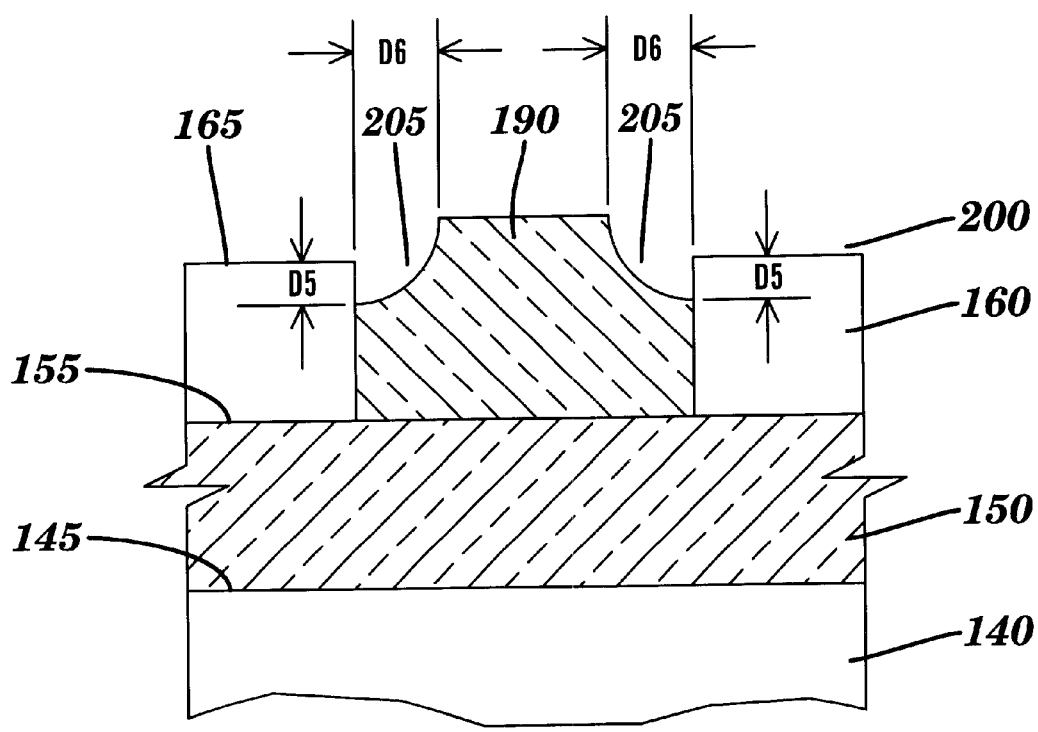

In FIG. 3G, gate oxide layer 202 is etched in buffered hydrofluoric acid (BHF.) BHF is comprised of one part of 49% HF, five parts of 30% $NH_4OH$ and eight parts of water, all by weight. BHF is an isotropic etchant for oxides. Wherever the nitrogen implant impinges on STI 190, the etch rate of the HDP oxide in BHF increases from about 1.5 times that of thermal oxide to about 6 times that of thermal oxide. In order to ensure that the gate oxide layer is etched through completely an over etch is performed. The etch time of the gate oxide layer etch process in BHF is selected to remove about 40 to 140 Å of gate oxide, though only about 20 to 70 Å are present. This increased etch rate of nitrogen implanted HDP in BHF results in formation of large divots 205 along the periphery of STI 190 when the gate oxide is etched. Divot 205 extends a linear distance "D5" below top surface 165 of silicon layer 160 and is a linear distance "D6" wide. In one example, "D5" and "D6" are in excess of about 500 Å.

Figure 4A:
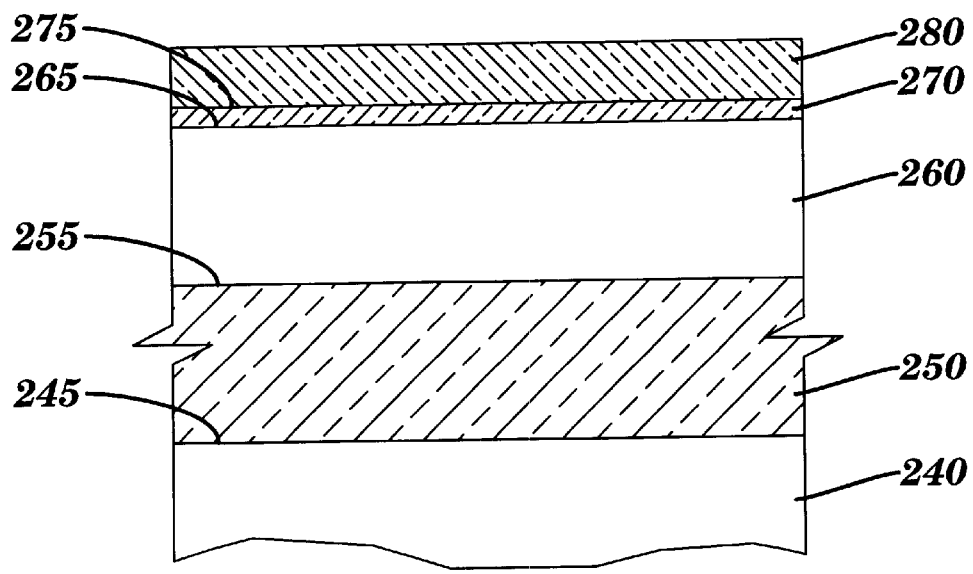
FIGS. 4A through 4G are partial cross-sectional views illustrating the method of reducing STI divot formation according to the present invention.

FIGS. 4A through 4G are partial cross-sectional views illustrating the method of reducing STI divot formation according to the present invention. In FIG. 4A, a silicon substrate 240 has a top surface 245. Formed on top surface 245 of silicon substrate 240 is a BOX layer 250 have a top surface 255. Formed on top surface 255 of BOX layer 250 is a silicon layer 260 having a top surface 265. In one example, silicon layer 260 is about 300 to 2000 Å thick. Formed on top surface 265 of silicon layer 260 is a pad oxide layer 270 having a top surface 275. Formed on top surface 275 of pad oxide layer 270 is a pad nitride layer 280. In one example, pad oxide layer 270 is a thermal oxide formed by oxidation of upper portions of silicon layer 270 and is about 60 to 250 Å thick and pad nitride layer 280 is formed by a CVD process and is about 500 to 1500 Å thick.

Figure 4B:
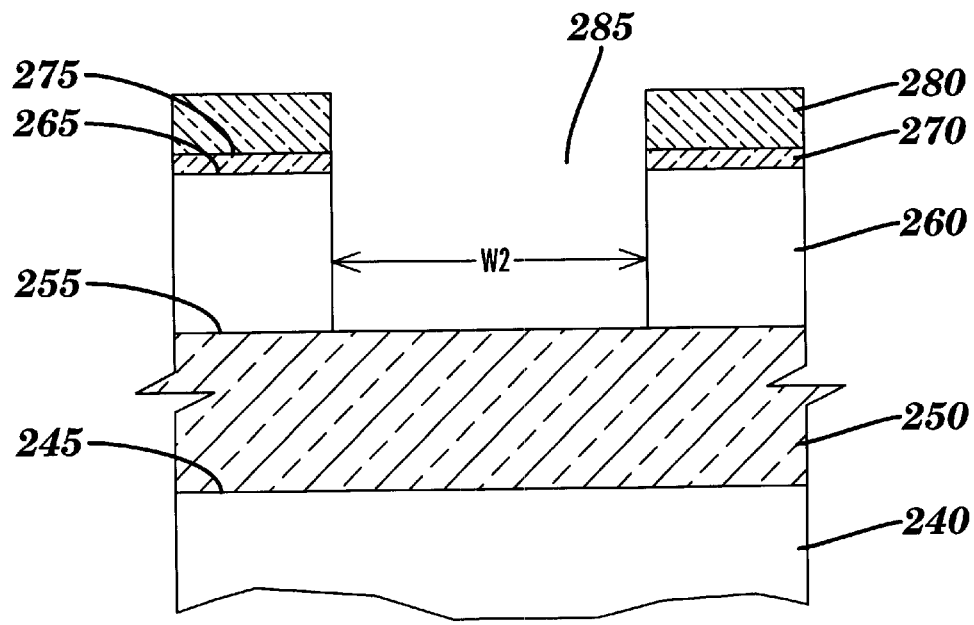

In FIG. 4B, a trench 285 is formed through pad nitride layer 280, pad oxide layer 270 and silicon layer 260 to expose top surface 255 of BOX layer 250. Trench 285 is formed by forming and patterning a photoresist layer on pad nitride layer 280, plasma etching the pad nitride layer, stripping the photoresist layer, wet etching the pad oxide layer, and plasma etching the silicon layer. Trench 285 is "W2" wide. In one example, "W2" is 500 Å or greater.

Figure 4C:
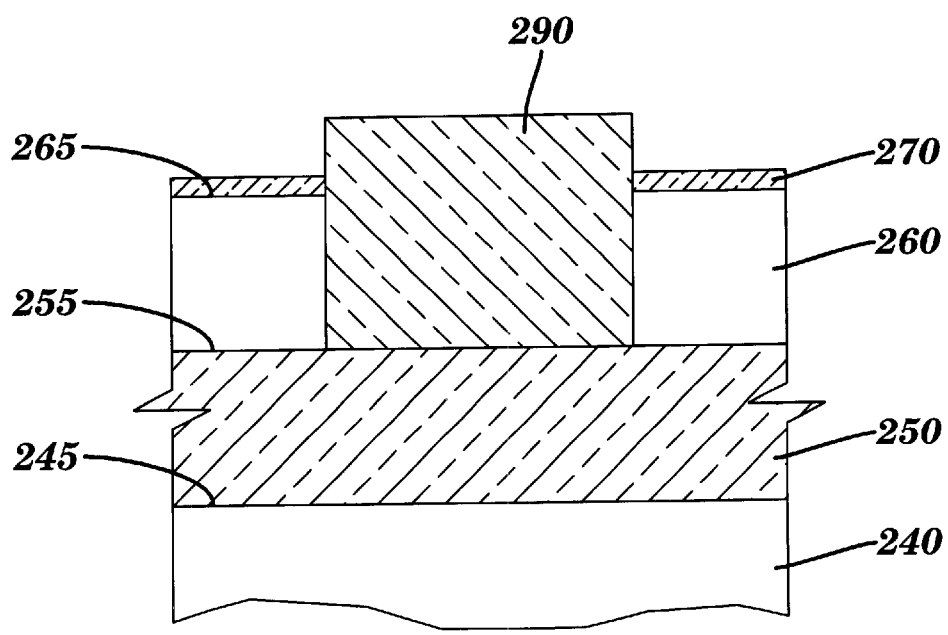

In FIG. 4C, trench 285 (see FIG. 4B) is filled with dielectric, in the present example, a high-density plasma (HDP) oxide; the oxide is chemically-mechanically-polished (CMP) to form STI 290 and pad nitride layer 280 (see FIG. 4B) removed. HDP oxide may be formed in a Concept Tool manufactured by Novellus Corp. of San Jose, Calif. running a mixture of $SiH_4$ and $O_2$ gases at about 3600 to 4000 watts and about 100 millitorr. Alternative dielectrics for STI 290 include high temperature CVD (HTCVD) oxide, low pressure CVD (LPCVD) oxide, tetraethoxysilane (TEOS) oxide and other deposited oxides. The removal of pad nitride layer 280 reduces the thickness of pad oxide layer 270 from about 60 to 250 Å to about 45 to 250 Å.

Figure 4D:
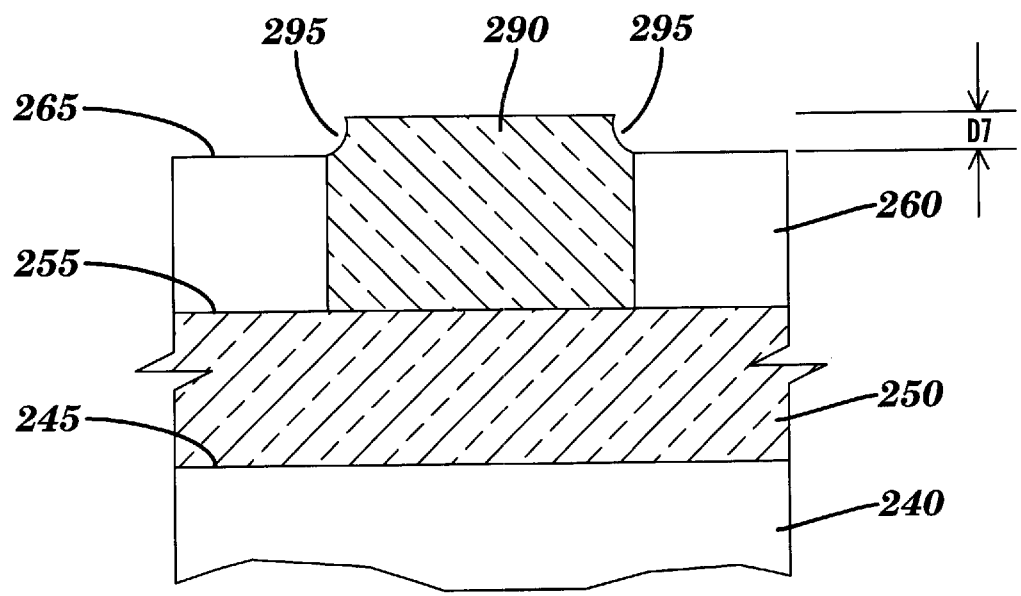

In FIG. 4D, pad oxide layer 270 (see FIG. 4C) is removed using DHF to expose top surface 265 of silicon layer 260. DHF comprises an aqueous solution of 1 part 49% HF by weight to 80 parts of water by weight. The etch rate of the HDP oxide of STI 290 in DHF is about one to two times the etch rate of the thermal oxide of pad oxide layer 270 in DHF. In order to ensure that all of pad oxide layer 270 is removed an over etch is performed. The etch time of the pad oxide layer removal process in DHF is selected to remove about 70 to 400 Å of pad oxide, though only about 45 to 250 Å are present.

Alternatively, a chemical oxide removal (COR) process may be used to remove pad oxide layer 270. COR is a two-step process. The first step of COR may be run in an AMAT 5000 tool manufactured by AME Corp of Santa Clara, Calif., using a mixture of NH3 at a flow rate of about 1 to 35 sccm and HF vapor at a flow rate of about 0 to 100 sccm, a pressure of 2 to 100 millitorr and a temperature of about 15 to 35° C. In the first step a self-passivating oxide layer and an ammonium biflouride by-product are formed. The second step of COR is a 100° C. insitu thermal desorption anneal. The first and second steps are repeated as many times are required to remove the desired thickness of oxide. The etch rate of the HDP oxide of STI 290 in COR is about the same as the etch rate of the thermal oxide of pad oxide layer 270 in COR. In order to ensure that all of pad oxide layer 270 is removed an over etch is performed. The COR pad oxide layer removal process is performed a sufficient number of times to remove about 60 to 400 Å of pad oxide, though only about 45 to 250 Å are present.

Some of STI 290 is also removed. After removal of pad oxide layer 270, STI 290 extends a distance "D7" above top surface 265 of silicon layer 260. In one example, "D7" using a COR process is about 800 to 1500 Å and using a DHF etchant about 700 to 1300 Å. Since both COR and DHF are isotropic etchants for oxides concavities 295 are formed along the exposed periphery of STI 290.

Figure 4E:
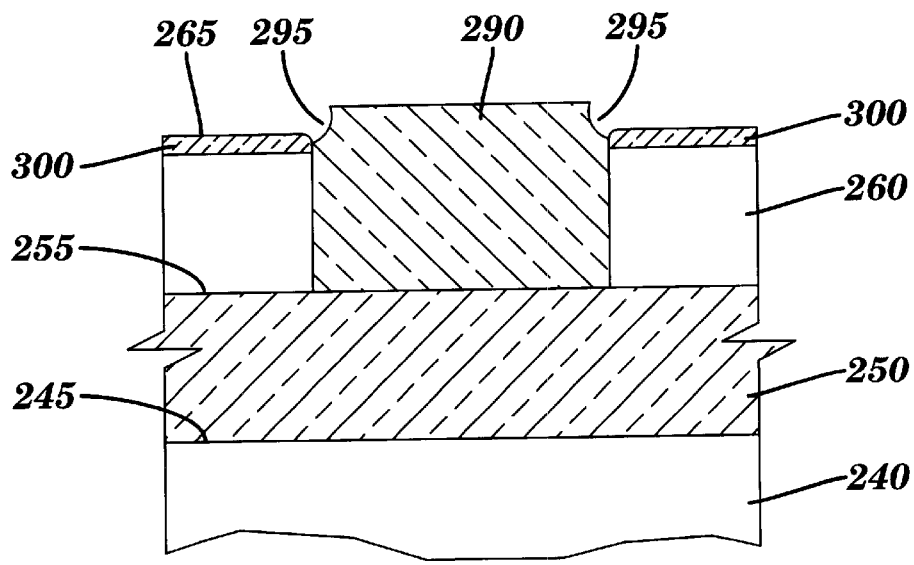

In FIG. 4E, a sacrificial oxide layer 300 is thermally grown on top surface 265 of silicon layer 260. By the nature of thermal oxidation processes, an upper portion of silicon layer 260 is converted to silicon oxide. In one example, sacrificial oxide layer 300 is 40 to 250 Å thick. At this point, various fabrication processes may be performed. For example, in the case of complementary-metal-oxide-silicon (CMOS) device fabrication Nwell and Pwell ion implants are performed. The purpose of sacrificial oxide layer 300 is to protect top surface 265 of silicon layer 260.

Figure 4F:
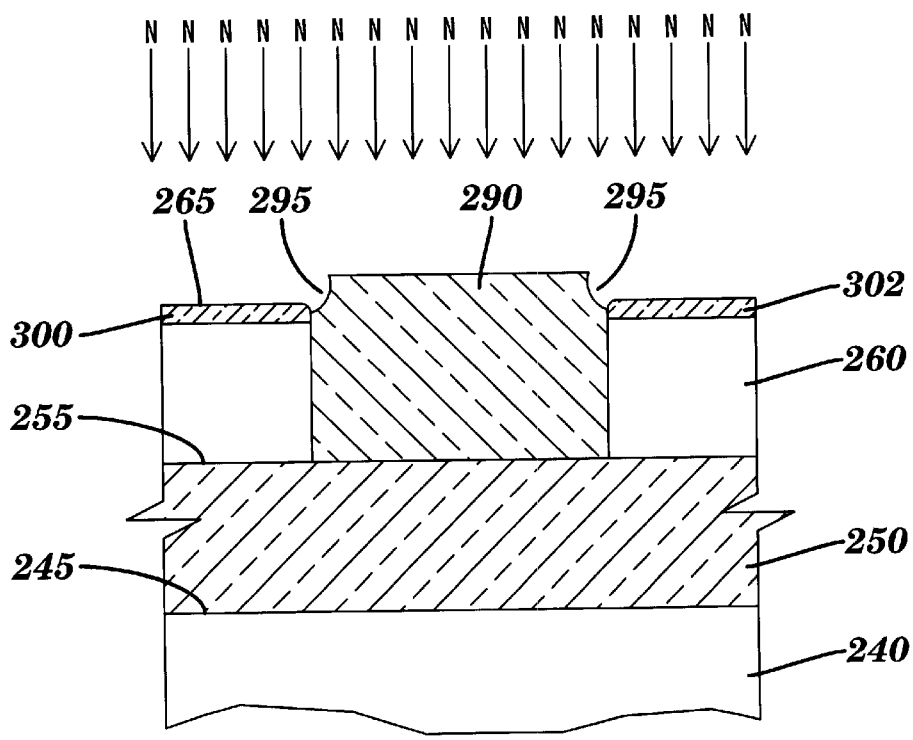

In FIG. 4F, sacrificial oxide layer 300 (see FIG. 4E) is removed using DHF. In order to ensure that all of sacrificial oxide layer 300 is removed an over etch is performed. The etch time of the sacrificial oxide layer removal process in DHF is selected to remove about 70 to 400 Å of sacrificial oxide, though only about 40 to 250 Å are present.

Alternatively, a COR process may be used to remove sacrificial oxide layer 300. The COR pad oxide layer removal process is performed a sufficient number of times to remove about 60 to 400 Å of sacrificial oxide layer 300, though only about 40 to 250 Å are present.

Continuing the example of a CMOS device, about a 20 to 70 Å thick thermal gate oxide layer 302 is grown on top surface 265 of silicon layer 260. A nitrogen ion implantation is then performed.

Figure 4G:
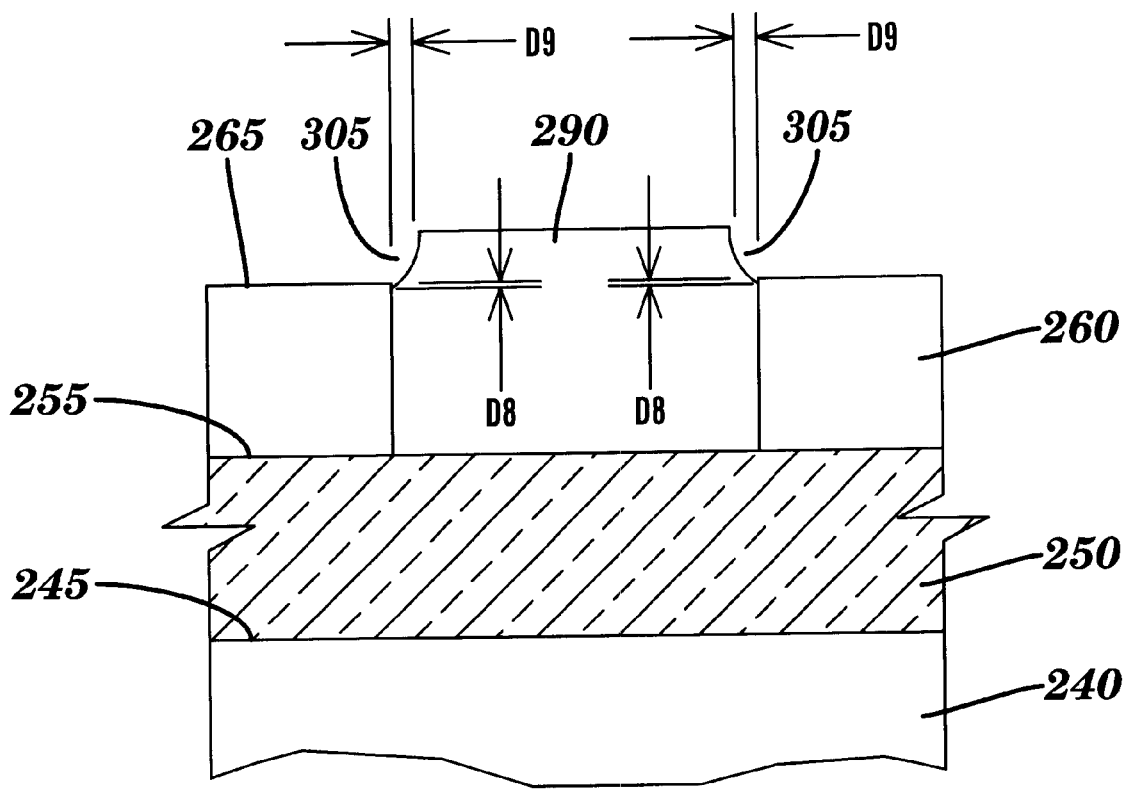

In FIG. 4G, gate oxide layer 302 is etched using a COR process. Wherever the nitrogen implant impinges on STI 290, the COR etch rate of the HDP oxide decreases to about one half or less that of thermal oxide. In other words, the etch rate ratio between the gate (thermal) oxide and nitrogen implanted HDP (deposited) oxide is at least 1:1. In order to ensure that the gate oxide layer is etched through completely an over etch is performed. The COR gate oxide layer removal process is performed a sufficient number of times to remove about 40 to 140 Å of gate oxide. The decreased etch rate of nitrogen implanted HDP by COR processing and the self-limiting nature of COR oxide etching results in elimination of or reduced size divots 305 along the periphery of STI 290 when the gate oxide is etched. Divot 305 extends a distance "D8" below top surface 265 of silicon layer 260 and is "D9" wide. In one example, "D8" is about 0 to 20 Å and "D9" is about 0 to 250 Å.

Table I shows the amount of HDP (HDP) oxide lost (based on experimental measurement) when DHF and BHF are used to strip (etch) pad oxide, sacrificial oxide and gate oxide layers vs. when a COR process is used to strip (remove) pad oxide, sacrificial oxide and gate oxide layers.

TABLE I

AMOUNT OF HDP (STI) OXIDE LOSS

| PROCESS | PAD OXIDE STRIP | SACRIFICIAL OXIDE STRIP | GATE OXIDE STRIP |
|---------|-----------------|-------------------------|------------------|
| DHF     | 120 Å           | 120 Å                   |                  |
| BHF     |                 |                         | 370 Å            |
| COR     | 80 Å            | 72 Å                    | 37 Å             |

As may be seen from Table I, the use of COR is most efficacious in terms of not removing HDP (STI) when used for gate oxide strip (providing for ten times less HDP loss), but also has significant effect on HDP (STI) when used for pad oxide and sacrificial oxide strip. In both processes (DHF/BHF vs. COR) the HDP (STI) was subjected to a nitrogen ion implant and the same thicknesses of pad oxide, sacrificial oxide and gate oxide were stripped. Different amounts of HDP (STI) were lost because the pad oxide, sacrificial oxide and gate oxide were of different thicknesses from one another requiring different etch times.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, nitrogen implantation may be replaced with implantation of other atoms such as argon, hydrogen, phosphorus, arsenic, boron, helium and germanium. Also, while the present invention has been illustrated and described for SOI technology, the invention is also applicable to bulk silicon technology. Therefore it is intended that the following claims cover all such modifications and changes as fall within the true spirit and scope of the invention.

What is claimed is:

1. A method for limiting divot formation in shallow trench isolation structures comprising in sequence the steps of:
   providing a trench formed in a silicon region with a deposited oxide within said trench;
   oxidizing a top layer of said silicon region to form a layer of thermal oxide on top of said silicon region; and
   selectively etching said thermal oxide with respect to said deposited oxide, said thermal oxide etching faster than said deposited oxide.

2. The method of claim 1, wherein the selectively etching does not form a divot along a periphery of said trench or does form a divot along the periphery of said trench such that a maximum linear dimension of the divot does not exceed 500 Å.

3. The method of claim 1, wherein the etch rate ratio of thermal oxide to deposited oxide is at least 2:1.

4. The method of claim 1, wherein said deposited oxide is selected from the group consisting of high density plasma oxide, high temperature chemical vapor deposition oxide, low pressure chemical vapor deposition oxide and tetra-ethoxysilane oxide.

5. The method of claim 1, wherein the step of selectively etching said layer of thermal oxide with respect to said deposited oxide is a chemical oxide removal process.

6. The method of claim 5, wherein said chemical oxide removal process comprises at least one sequence of a vapor etch step using a mixture of NH3 and HF followed by a desorption anneal step.

7. The method of claim 1, further including, before the step of selectively etching, the step of implanting said layer of thermal oxide and said deposited oxide with a species selected from the group consisting of nitrogen, argon, hydrogen, phosphorus, arsenic, boron, helium and germanium.

8. A method for forming shallow trench isolation structures comprising:
   forming a first layer of thermal oxide on a silicon region;
   forming a trench through said first layer of thermal oxide into said silicon region;
   filling said trench with a deposited oxide;
   removing said first layer of thermal oxide;

forming a second layer of thermal oxide on said silicon region; and selectively etching said second layer of thermal oxide with respect to said deposited oxide, said second layer of thermal oxide etching faster than said deposited oxide.

9. The method of claim 8, wherein the selectively etching does not form a divot along a periphery of said trench or does form a divot along the periphery of said trench such that a maximum linear dimension of the divot does not exceed 500 Å.

10. The method of claim 8, wherein the etch rate ratio of said second thermal oxide layer to deposited oxide is at least 2:1.

11. The method of claim 8, wherein said deposited oxide is selected from the group consisting of high density plasma oxide, high temperature chemical vapor deposition oxide, low pressure chemical vapor deposition oxide and tetra-ethoxysilane oxide.

12. The method of claim 8, wherein the step of selectively etching said second layer of thermal oxide with respect to said deposited oxide is a chemical oxide removal process.

13. The method of claim 12, wherein said chemical oxide removal process comprises at least one sequence of a vapor etch step using a mixture of NH3 and HF followed by a desorption anneal step.

14. The method of claim 8, further including the step of implanting said second layer of thermal oxide and said deposited oxide with a species selected from the group consisting of nitrogen, argon, hydrogen, phosphorus, arsenic, boron, helium and germanium.

15. A method for forming shallow trench isolation structures comprising:

forming a first layer of thermal oxide on a silicon region;

forming a trench through said first layer of thermal oxide into said silicon region;

filling said trench with a deposited oxide;

removing said first layer of thermal oxide and a top surface portion of said deposited oxide;

forming a second layer of thermal oxide on said silicon region; and selectively etching predefined areas of said second layer of thermal oxide with respect to said deposited oxide, said second layer of thermal oxide etching faster than said deposited oxide.

16. The method of claim 15, wherein the selectively etching does not form a divot along a periphery of said trench or does form a divot along the periphery of said trench such that a maximum linear dimension of the divot does not exceed 500 Å.

17. The method of claim 15, wherein the etch rate ratio of said second thermal oxide layer to deposited oxide is at least 2:1.

18. The method of claim 15, wherein said deposited oxide is selected from the group consisting of high density plasma oxide, high temperature chemical vapor deposition oxide, low pressure chemical vapor deposition oxide and tetra-ethoxysilane oxide.

19. The method of claim 15, wherein the step of selectively etching said second layer of thermal oxide with respect to said deposited oxide is a chemical oxide removal process.

20. The method of claim 19, wherein said chemical oxide removal process comprises at least one sequence of a vapor etch step using a mixture of NH3 and HF followed by a desorption anneal step.

21. The method of claim 15, further including the step of implanting said second layer of thermal oxide and said deposited oxide with a species selected from the group consisting of nitrogen, argon, hydrogen, phosphorus, arsenic, boron, helium and germanium.

22. The method of claim 15 wherein said step of removing said first layer of thermal oxide and a top surface portion of said deposited oxide is performed using a process selected from the group consisting of dilute HF etching, buffered HF etching and chemical oxide removal.

23. The method of claim 15 further including the steps of:

forming a third layer of thermal oxide on said silicon region after said removing of said first layer of thermal oxide;

removing said third thermal layer of oxide and an additional top surface portion of said deposited oxide;

wherein said step of removing said third thermal layer of oxide is selected from the group consisting of dilute HF etching, buffered HF etching and chemical oxide removing.

* * * * *